(12) United States Patent
Elian et al.

(10) Patent No.: US 7,964,448 B2
(45) Date of Patent: Jun. 21, 2011

(54) ELECTRONIC DEVICE AND METHOD OF MANUFACTURING SAME

(75) Inventors: Klaus Elian, Alteglofsheim (DE); Jochen Dangelmaier, Beratzhausen (DE)

(73) Assignee: Infineon Technologies AG, Neubiberg (DE)

( * ) Notice: Subject to any disclaimer, the term of this patent is extended or adjusted under 35 U.S.C. 154(b) by 161 days.

(21) Appl. No.: 12/212,667

(22) Filed: Sep. 18, 2008

(65) Prior Publication Data
US 2010/0065961 A1 Mar. 18, 2010

(51) Int. Cl.
*H01L 21/44* (2006.01)
(52) U.S. Cl. .............. 438/113; 257/E21.501; 438/124
(58) Field of Classification Search .......... 257/698, 257/E21.501, E23.181; 438/124, 33, 68, 438/113, 114, 121, 127, 460, 589
See application file for complete search history.

(56) References Cited

U.S. PATENT DOCUMENTS

| | | | |
|---|---|---|---|
| 5,051,802 A | 9/1991 | Prost et al. | |
| 5,206,460 A | 4/1993 | Yang | |
| 5,943,558 A | 8/1999 | Kim et al. | |
| 6,498,392 B2 * | 12/2002 | Azuma | 257/676 |
| 7,445,959 B2 * | 11/2008 | Theuss | 438/108 |
| 7,528,522 B2 * | 5/2009 | Masuko et al. | 310/313 A |
| 2004/0027218 A1 | 2/2004 | Stafford et al. | |
| 2004/0259325 A1 | 12/2004 | Gan | |
| 2005/0006987 A1 | 1/2005 | Masuko et al. | |
| 2006/0001147 A1 | 1/2006 | Tomita et al. | |
| 2007/0210392 A1 | 9/2007 | Sakakibara et al. | |
| 2008/0061424 A1 | 3/2008 | Murayama et al. | |
| 2008/0128838 A1 | 6/2008 | Theuss | |

FOREIGN PATENT DOCUMENTS
DE 10348620 A1 6/2005
* cited by examiner

*Primary Examiner* — Tom Thomas
*Assistant Examiner* — (Vikki) Hoa B Trinh

(57) ABSTRACT

This application relates to a method of manufacturing a semiconductor device comprising: providing a metal carrier; placing the metal carrier into a mold for forming a molded structure holding the metal carrier; segmenting the metal carrier into at least two disconnected metal carrier segments; and attaching a semiconductor chip to the molded structure.

17 Claims, 13 Drawing Sheets

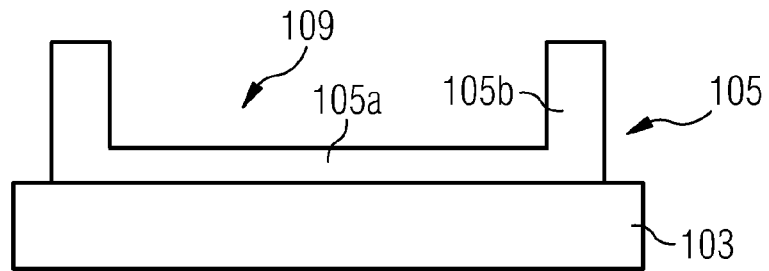
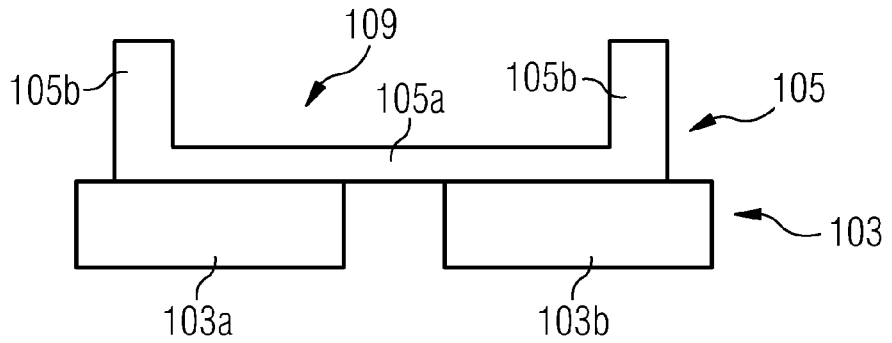
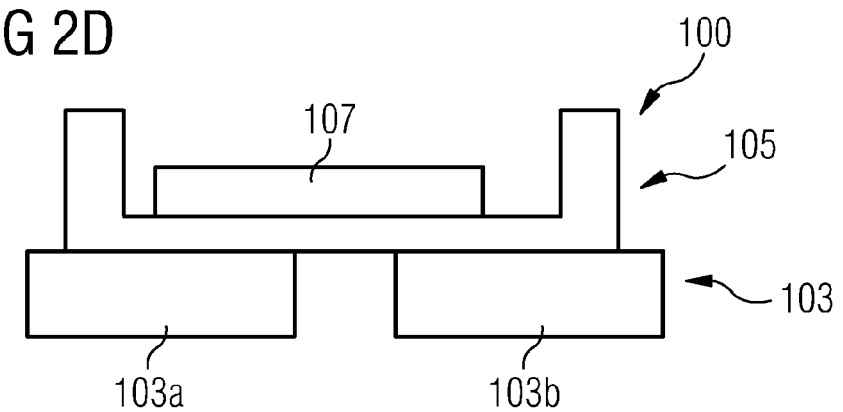

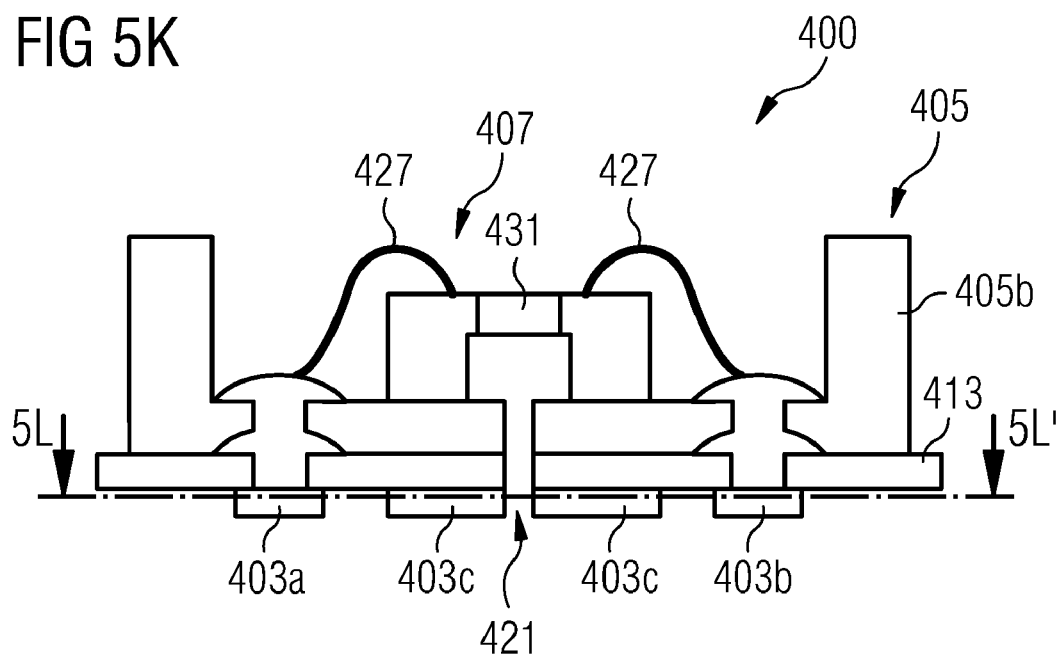
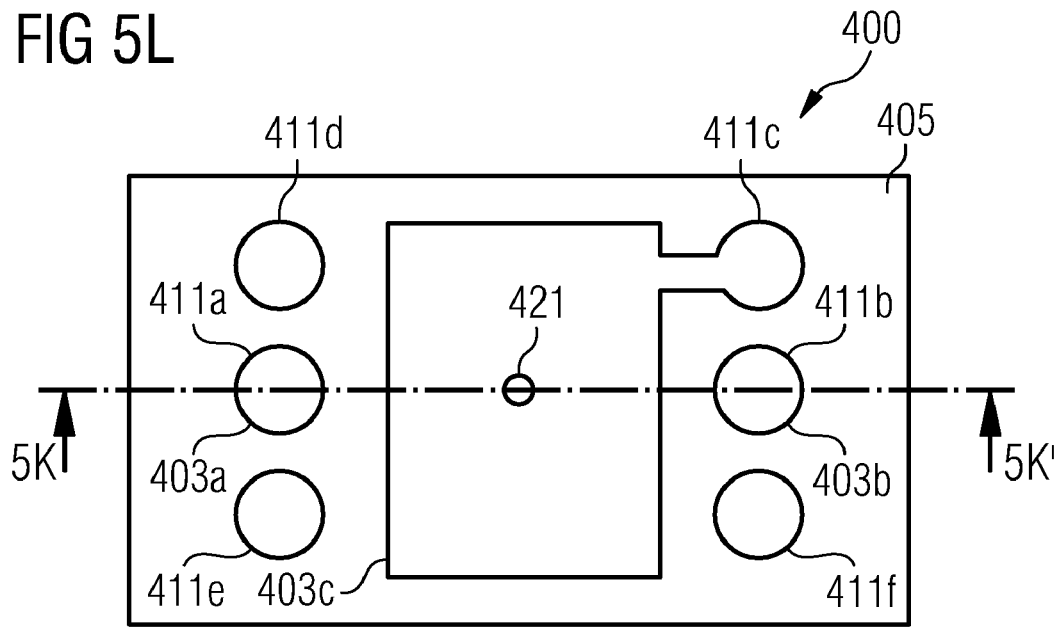

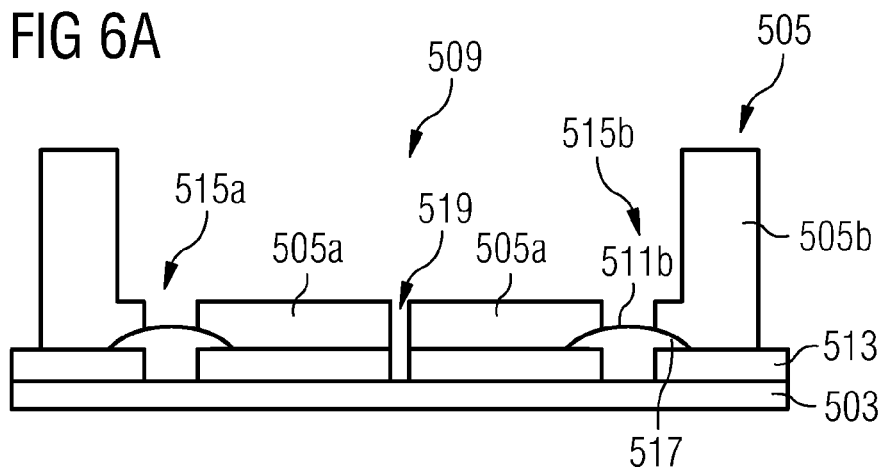
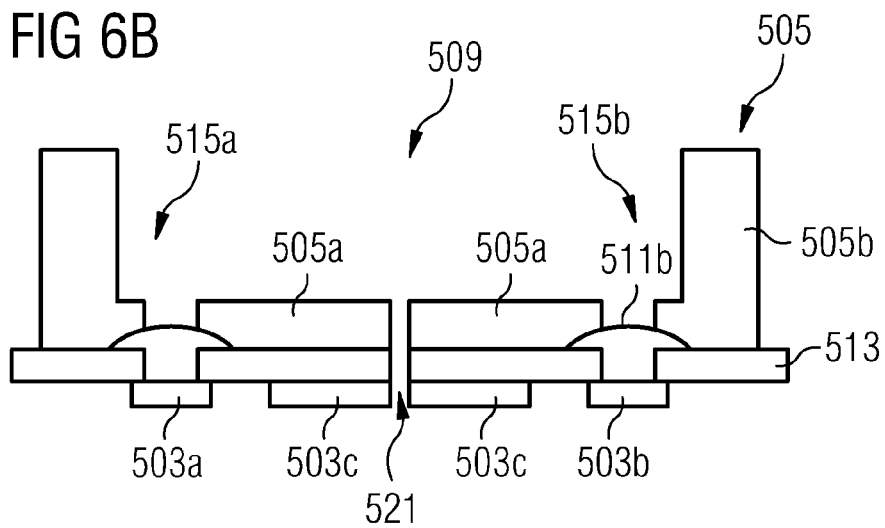
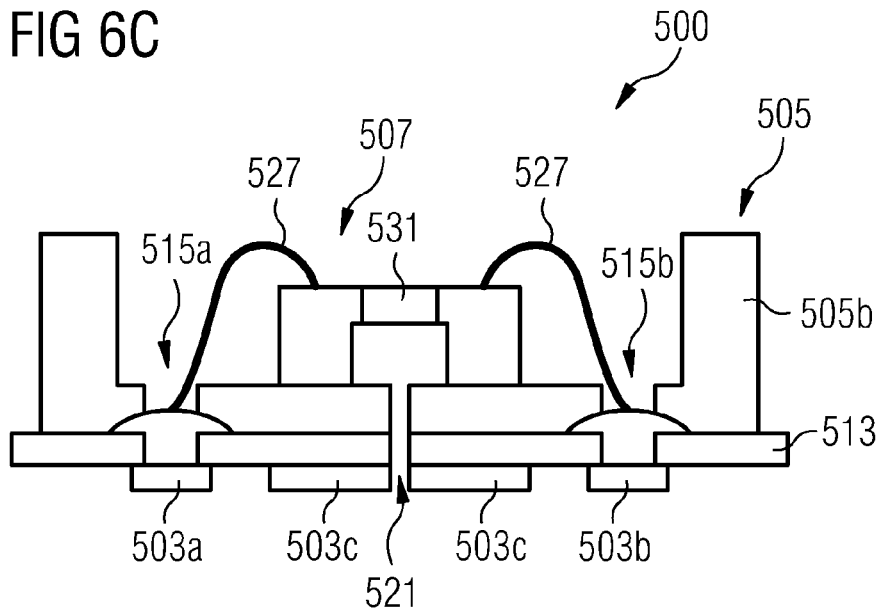

ELECTRONIC DEVICE AND METHOD OF MANUFACTURING SAME

FIELD OF THE INVENTION

The present invention relates to a semiconductor device and methods of manufacturing semiconductor devices.

BACKGROUND

Semiconductor chips can be used as substrates for integrating highly sensitive devices like electronic components, electronic circuits, sensors, micro-electromechanical systems, lasers, and the like. In order to protect the highly sensitive devices against environmental stress, e.g. caused by humidity, chemical processes, mechanical destruction, and the like, semiconductor chips are often encapsulated in encapsulation material. The application of encapsulation material to semiconductor chips, however, may create various problems.

SUMMARY

Accordingly, there is provided a method of manufacturing a semiconductor device comprising: providing a metal carrier; placing the metal carrier into a mold for forming a molded structure holding the metal carrier; segmenting the metal carrier into at least two disconnected metal carrier segments; and attaching a semiconductor chip to the molded structure.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 2A-2D schematically depict an embodiment of a method of manufacturing a semiconductor device that is similar to the embodiment of FIGS. 1A-1D, and wherein the molded structure comprises a cavity in which semiconductor chip is attached to the molded structure.

FIGS. 5A-5L schematically depict an embodiment of a method of manufacturing a semiconductor device wherein a masking layer is located between the metal carrier and the molded structure and wherein each of the multiple protruding metal elements comprises two interlocking elements.

FIGS. 6A-6C schematically depict an embodiment of a method of manufacturing a semiconductor device wherein a masking layer is located between the metal carrier and the molded structure and wherein each of the multiple protruding metal elements comprises one interlocking elements.

DETAILED DESCRIPTION

Although specific embodiments have been illustrated and described herein, it will be appreciated by those of ordinary skill in the art that a variety of alternate and/or equivalent implementations may be substituted for the specific embodiments shown and described without departing from the scope of the present invention. Generally, this application is intended to cover any adaptations or variations of the specific embodiments discussed herein. Therefore, it is intended that this invention be limited only by the claims and the equivalents thereof.

Figure 1A:
FIGS. 1A-1D schematically depict an embodiment of a method of manufacturing a semiconductor device 1 comprising providing a metal carrier (FIG. 1A), placing the metal layer into a mold for forming a molded structure (FIG. 1B), segmenting the metal carrier (FIG. 1C), and attaching a semiconductor chip to the molded structure (FIG. 1D).

The FIGS. 1A-1D depict an embodiment of manufacturing a semiconductor device 1. FIG. 1A depicts metal carrier 3 for carrying a semiconductor chip. In one embodiment, metal carrier 3 may be a structured or unstructured sheet of metal, for example a plate or foil. Metal carrier 3 may be made of a metal, like copper, a copper alloy, gold, gold alloy, silver, a silver alloy, tin, a tin alloy, iron, iron alloy, steel, steel alloy, nickel, nickel alloy, and the like. The thickness of the metal carrier may vary depending on the application. For example, the thickness of the metal carrier 3 may be as small as 100 micrometers and be as large as 1 to 10 millimeter for applications that need a robust design, or larger. In one embodiment, metal carrier 3 may be a non-metal sheet covered with a metal layer. In this case the metal layer may be as thin as a few hundred nanometer or less.

Figure 1B:
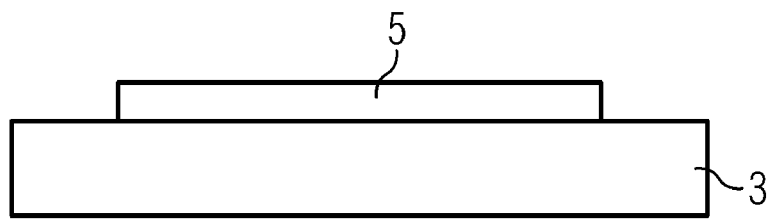

FIG. 1B depicts the device of FIG. 1A after metal carrier 3 has been placed into a mold for forming a molded structure 5 holding metal carrier 3. In FIG. 1B, molded structure 5 has the shape of a layer covering a surface of metal carrier 3. By placing metal carrier 3 into a mold, a fluid mold material can be applied to metal carrier 3 to become a molded structure 5 once the fluid mold material has been adapted to the mold form and solidified in the mold. In one embodiment, the fluid mold material is a polymer heated to temperatures in the range of 150 to 190 degree Celsius. In one embodiment, the temperature range is between 160 and 180 degree Celsius. In this case, solidification takes place by cooling the mold material in the mold to room temperature. It is well known that there are many different types of mold materials around that can be used for producing molded structure 5. The choice of the preferred mold material depends on the requirements regarding thermal expansion coefficients, humidity resistance, aging behavior, stability against chemicals, like water, acids, basic compounds, organic solvents, motor oil, petrol, dust particles, oxygen, corroding gaseous compounds and the like. The specific required stabilities depend on the specific applications, e.g. in motor vehicles under harsh conditions, like in motor management or in less critical applications, like handhelds.

Metal carrier 3 is placed into the mold for the molded structure 5 to hold metal carrier 3. Holding the metal carrier 3 can be achieved in several ways. In one embodiment a mold material is taken that adheres to metal carrier 3 once the mold material has solidified. In another embodiment, the metal carrier 3 that has interlocking elements that interlock with the mold material once it is solidified. For example, in one embodiment, metal carrier 3 may be a sheet of metal with one or several through-holes. In this case, the fluid mold material may enter into the through-holes so that the mold material in the through-holes interlocks with the metal carrier 3 such that molded structure 5 can hold metal carrier 3. In still another embodiment, holding metal carrier 3 can be achieved by using a mold that enables the fluid mold material to flow around metal carrier 3 so that molded structure 5 interlocks with metal carrier 3 once molded structure 5 has solidified.

Figure 1C:
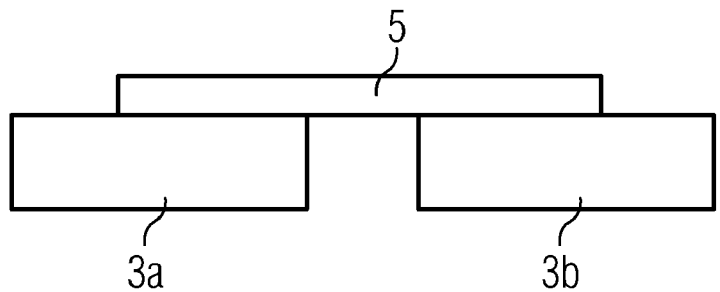

FIG. 1C depicts the device of FIG. 1B after segmenting metal carrier 3 into at least two disconnected metal carrier segments 3a, 3b. By segmenting metal carrier 3 into multiple metal carrier segments 3a, 3b, the multiple metal carrier segments 3a, 3b can be used as independent input/output terminals that can be soldered to a printed circuit board. Segmenting of metal carrier 3 can be carried out in various conventional techniques, e.g. by selective etching metal carrier 3, sawing metal carrier 3 form the backside of the device, and the like.

Figure 1D:
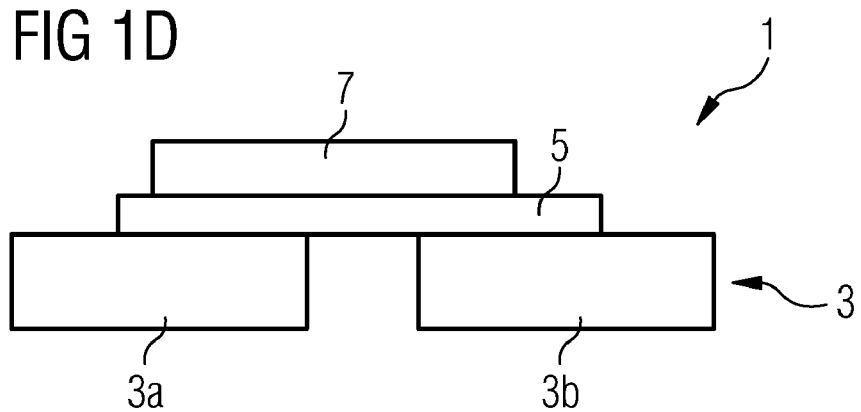

FIG. 1D depicts the device of FIG. 1C after attaching a semiconductor chip 7 to molded structure 5. In this embodiment, molded structure 5 serves as a structure to hold the metal carrier segments 3a, 3b and, being made of an electrically insulating material, as an insulating layer for electrically insulating semiconductor chip 7 from metal carrier segments 3a, 3b. Semiconductor chip 7 may include an integrated circuit, a sensor, a photonic sensor, a photon emitting device (e.g. laser), a pressure sensor, an acoustic sensor, an acceleration sensor, a chemical sensor, and related components. With molded structure 5 being made of an electrically insulating material, the backside of semiconductor chip 7 is electrically insulated from metal carrier 3 while at the same time, the front side of semiconductor chip 7 is free to be electrically contacted to metal carrier segments 3a, 3b with interconnect elements like bond wires, ribbons, clips, and the like (not shown in FIG. 1D).

FIGS. 2A-2D depict a method of manufacturing a semiconductor device 100 that in many ways is similar to the one shown in the previous FIGS. 1A-1D. FIG. 2A discloses a metal carrier 103 that may or may not be the same as metal carrier 3 of FIG. 1A. FIG. 2B discloses a molded structure 105 that has been obtained by placing metal carrier 103 into a mold. Different from the embodiment of FIGS. 1A-1D, the mold is shaped such that during solidification, the liquid mold material in the mold takes on the shape of a molded structure 5 having a cavity 109. In FIG. 2B, cavity 109 of molded structure 5 is defined by a molded structure floor element 105a and a closed molded structure wall element 105b surrounding floor element 105a in a circular or rectangular manner.

FIG. 2C depicts the device of FIG. 2B after metal carrier 103 has been segmented into at least two disconnected metal carrier segments 103a, 103b. Segementing can be done in the same way as was described in FIG. 1C.

FIG. 2D depicts the device of FIG. 2C after semiconductor chip 107 has been attached to floor element 105a within cavity 109. The attachment may be carried out, e.g., by gluing the chip to molded structure 105. Due to wall element 105b surrounding semiconductor chip 107 in a closed loop, semiconductor chip 107 is protected against mechanical destruction from the bottom and the side. Further, since the wall elements 105b are higher than the thickness of semiconductor chip 107, a flat top lid (not shown in FIG. 2D) may be used to hermetically seal the cavity 109 to protect semiconductor chip 107 from harming environmental influences. In the embodiment of FIGS. 2A-2D, molded structure 105 serves as a structure to hold the metal carrier segments 103a, 103b, as an insulating layer for electrically insulating semiconductor chip 107 from metal carrier segments 103a, 103b, and as a protecting housing for semiconductor chip 107.

Since cavity 109 is larger than the volume of semiconductor chip 107, semiconductor chip 107 interfaces with molded structure 105 only at one of the two main surfaces of the chip. Since semiconductor material and mold material usually have different coefficients of thermal expansion, having a small interface between semiconductor chip 107 and molded structure 105 helps reducing mechanical stress on semiconductor chip 107 during temperature cycles.

Figure 3A:
FIGS. 3A-3E schematically depict an embodiment of a method of manufacturing a semiconductor device wherein the metal carrier comprises multiple protruding metal elements.
Figure 3B:
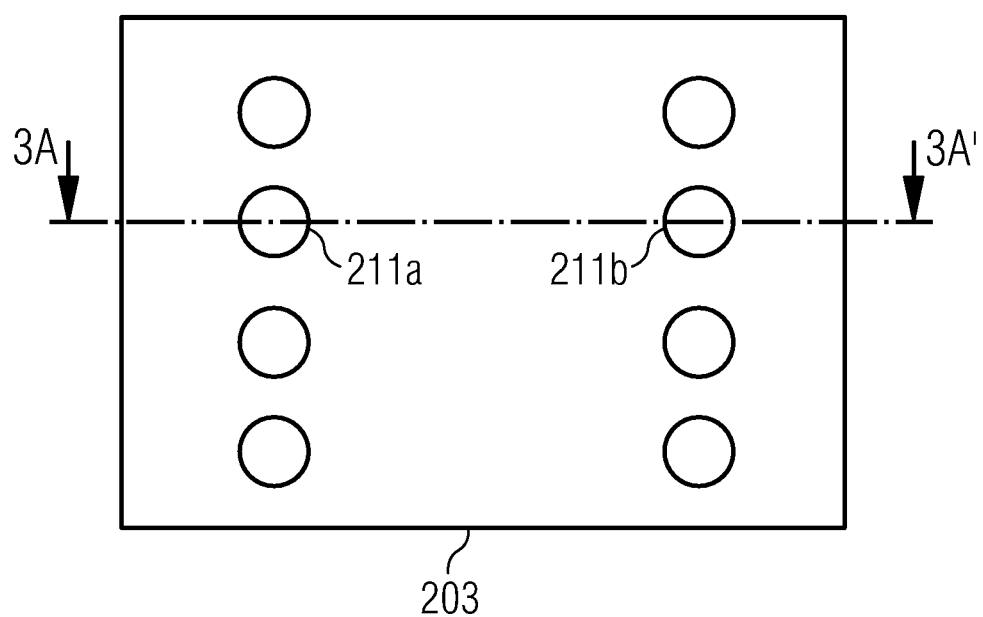

FIGS. 3A-3E depict a method of manufacturing a semiconductor device 200 that in many ways is similar to the one shown in the previous FIGS. 2A-2D. FIG. 3A is a cross section of metal carrier 203 of FIG. 3B along a line 3A-3A'. FIGS. 3A and 3B disclose a metal carrier 203 that, different from FIG. 2A, has eight protruding metal elements 211a, 211b that protrude from a main surface of metal carrier 203. The multiple protruding metal elements 211a, 211b may serve as holding means for holding molded structure 205 after molding (see FIG. 3C), and as external input/output contacts for controlling semiconductor chip 207 (see FIG. 3E). The height of the protruding metal elements 211a, 211b depends on the application and may vary, e.g., between 10 micrometers and a few millimetres. The protruding metal elements 211a, 211b may be generated by known conventional means. For example, the protruding metal elements 211a, 211b may be generated by selective galvanic growth on metal carrier 203, or by selective etching into a flat metal sheet.

Figure 3C:
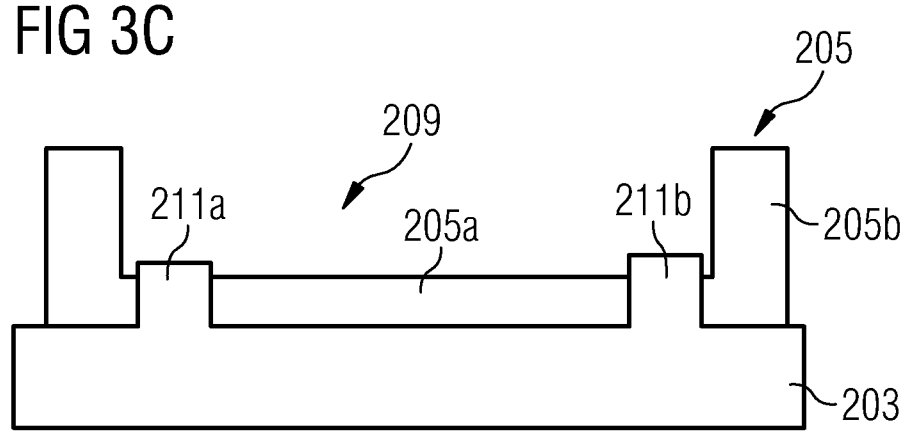

FIG. 3C depicts the device of FIGS. 3A, 3B, after a molded structure 205 that has been produced by placing metal carrier 203 into a mold. Similar to the embodiment of FIGS. 2A-2D, the mold is shaped such that during solidification, the liquid mold material in the mold takes on the shape of a housing with a cavity 209. Like in FIG. 2B, cavity 209 is defined by molded structure floor element 205a and molded structure wall element 205b surrounding floor element 205a in a circular or rectangular manner. Further, as can be seen in FIG. 3C, molded structure floor element 205a is interlocked with the multiple protruding metal elements 211a, 211b.

Figure 3D:
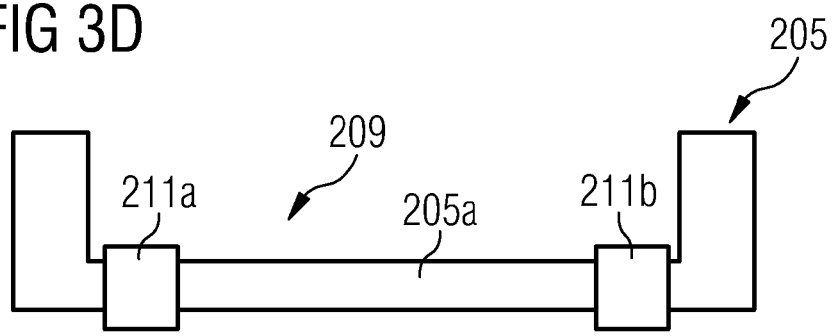

FIG. 3D depicts the device of FIG. 3C after metal carrier 203 has been segmented. In this embodiment, segmenting is done by etching without a second masking layer on the backside of metal carrier 203, until metal carrier 203 is segmented into eight disconnected metal carrier segments 203a, 203b. This way, the remaining metal carrier segments 203a, 303b are essentially identical with the protruding metal elements 211a, 211b.

Figure 3E:
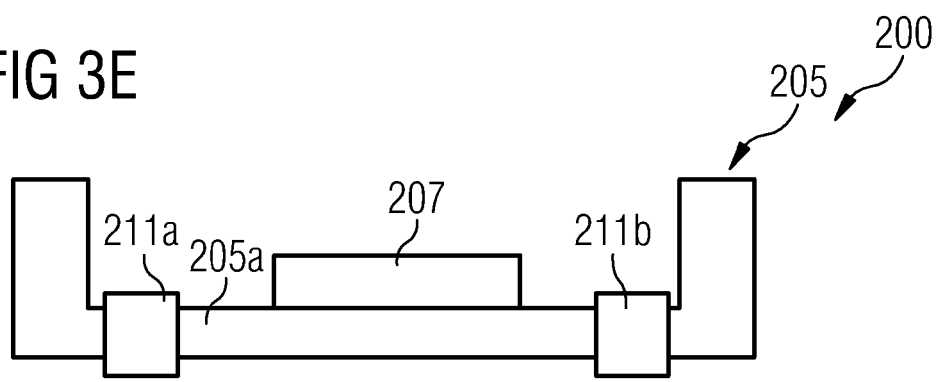

FIG. 3E depicts the device of FIG. 3D after semiconductor chip 207 has been attached to floor element 205a within cavity 209. The attachment may be carried out, e.g., by gluing the chip to molded structure 205. Due to wall element 205b surrounding semiconductor chip 207 in a closed loop, semiconductor chip 207 is protected against mechanical shock from the bottom and the side. Further, since the wall elements 205b are higher than the thickness of semiconductor chip 207, a flat top lid (not shown in FIG. 3E) may be used to cover the opening of cavity 209. This way, semiconductor chip 207 can be hermetically sealed against harming environmental influences. Similar to the embodiment of FIGS. 2A-2D, molded structure 205 may serve as a structure to hold the protruding metal elements 211a, 211b of metal carrier 203 as well as an insulating layer for electrically insulating semiconductor chip 207 from protruding metal elements 211a, 211b, and as well as a protecting housing for semiconductor chip 207.

FIGS. 4A-4H depict an embodiment of manufacturing a semiconductor device 300 wherein a first masking layer 313 is applied over a metal carrier 303 and wherein protruding metal elements 311a, 311b are grown selectively to first masking layer 313 to form multiple protruding metal elements 311a, 311b with interlocking elements 317.

Figure 4A:
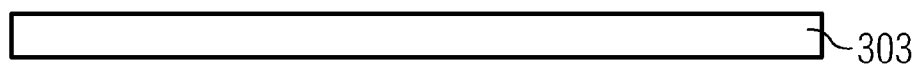
FIGS. 4A-4H schematically depict an embodiment of a method of manufacturing a semiconductor device wherein each of the multiple protruding metal elements comprise an interlocking element.
Figure 4B:
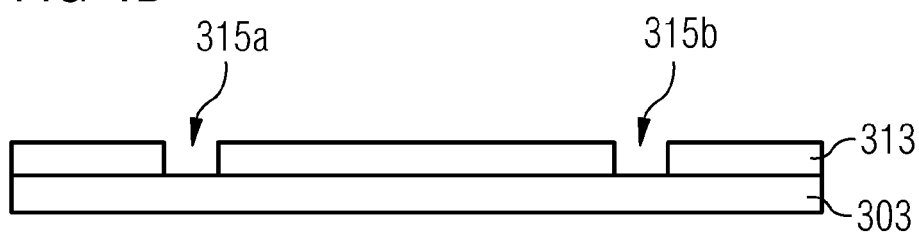

FIG. 4A depicts metal carrier 303 which may or may not be the same as metal carrier 203 of FIG. 3A. FIG. 4B discloses metal carrier 303 of 4A after a first masking layer 313 has been applied to metal carrier 303. First masking layer 313 may be a layer made of a photosensitive material that has been structured photo-lithographically in conventional ways to provide openings 315a, 315b to metal carrier 303. The openings 315a, 315b are to grow protruding metal elements 311a, 311b on metal carrier 303 selectively to first masking layer 313.

The photosensitive material of first masking layer 313 may be any commonly known photoresist material, e.g. based on Novolak-chemistry, or Polyimide-chemistry, or Acrylate or Methacrylate-chemistry, or Acetal-chemistry, all mixed with organic solvents and photosensitive compounds. Also possible are solid photoresist films, which are applicated as solid films on the surface 303. The solid films are afterwards exposed and finally developed with liquid developers. The lithographic process may include positive and negative tone processes. In addition to typical single-layer resist processes, also bilayer-processes or further additional functional layers that improve the patterning process may be used.

Figure 4C:
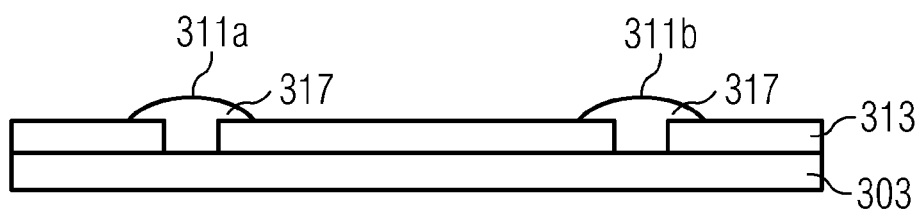

FIG. 4C depicts metal carrier 303 of FIG. 4B after metal carrier 303 has been immersed into an electrolyte and after applying a voltage between metal carrier 303 and the electrolyte to electrochemically (galvanically) grow the protruding metal elements 311a, 311b in the openings 315a, 315b. Alternatively, the protruding metal elements 311a, 311b may be grown electrochemically without external electric current. The protruding metal elements 311a, 311b are grown until they protrude over first masking layer 313 to form first interlocking elements 317. As can be seen in FIG. 4C, the first interlocking elements 317 are characterized by a mushroom shaped collar extending over first masking layer 313. Typically, the material of the protruding metal elements 311a, 311b is the same as the material of metal carrier 303. Typical values for the height of the protruding metal elements 311a, 311b may be in the range between 10 micrometers up to several millimeters.

Figure 4D:
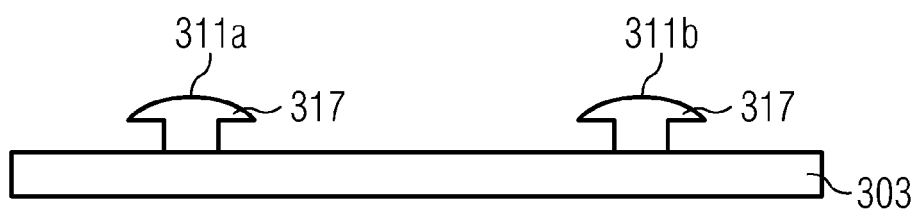

FIG. 4D depicts metal carrier 303 of FIG. 4C after first masking layer 313 has been removed. Removal of first masking layer 313 may be carried out by treatments typical for development processes used in lithography. For example treatment of the device with aquous alkaline developers, e.g. based on TMAH (Tetramethylammoniumhydroxide) base, organic solvents as, e.g., 1-Methoxy-2-propylacetat, or mixtures of different organic solvents. Also reactive organic solvents, e.g. N-Methylpyrrolidone, mixtures of organic solvents, water and basic compounds can be used. The treatment may be carried out with dip processes or with regular spin-coating. In addition, combined development processes with the help of dry plasma etch processes, like ashing, can be used.

Figure 4E:
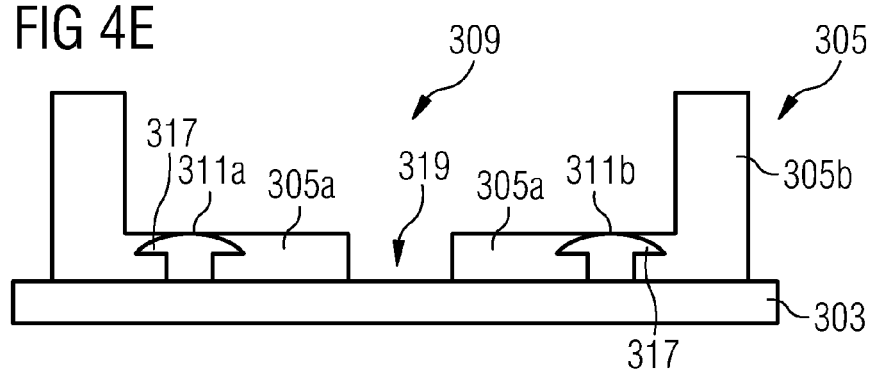

FIG. 4E depicts metal carrier 303 of FIG. 4D after metal carrier 303 has been placed into a mold to form a molded structure 305 interlocked with the first interlocking elements 317. Similar to the previous embodiments, the mold is shaped such that during solidification, the liquid mold material in the mold takes on the shape of a housing with a cavity 309. Cavity 309 of molded structure 305 may be defined by molded structure floor element 305a and molded structure wall element 305b surrounding floor element 305a in a circular or rectangular manner. In addition, molded structure 305 may be molded to provide an opening 319 for preparing a through-hole through metal carrier 303. FIG. 4E further discloses the interlocking of the protruding metal elements 311a, 311b with molded structure 305 to make sure that molded structure 305 is firmly attached to metal carrier 303.

Figure 4F:
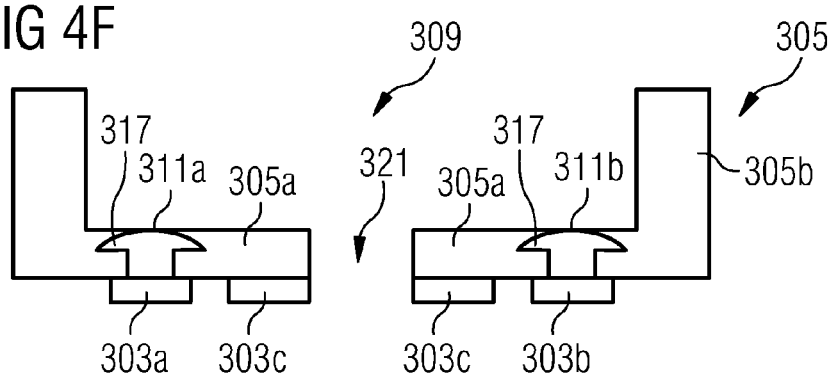

FIG. 4F depicts metal carrier 303 of FIG. 4E after metal carrier 303 has been segmented into multiple electrically disconnected metal carrier segments 303a, 303b, 303c, and until a circular opening 319 in metal carrier segment 303c is generated. Like in the previous embodiments, the segmentation may be done by conventionally etching metal carrier 303 selectively with respect to a second masking layer (not shown). After segmentation, first metal carrier segments 303a, 303b in FIG. 4F are still electrically connected with the respective protruding metal elements 311a, 311b while the metal carrier segments 303c is still electrically connected with protruding metal element 311c (see FIG. 4H).

Further, after segmentation, through-hole 321 leads through molded structure 305 and through metal carrier segments 303c. Through-hole 321 and metal carrier segments 303a, 303b, 303c are structured at the same time by the same process.

Figure 4G:
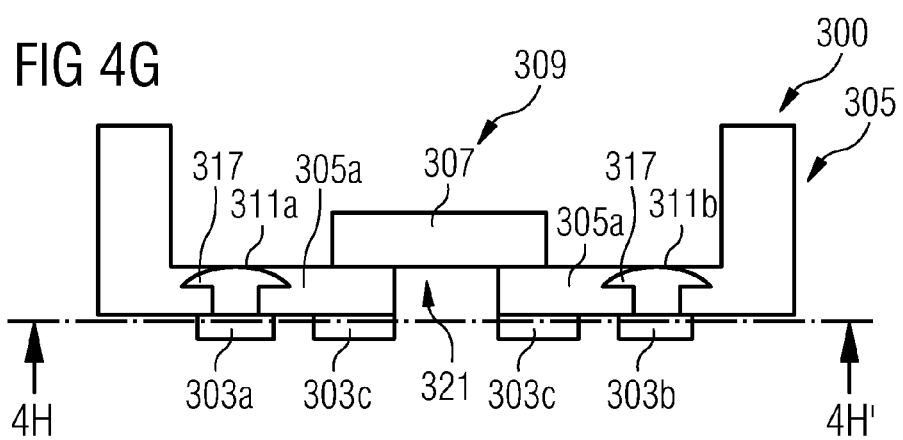
Figure 4H:
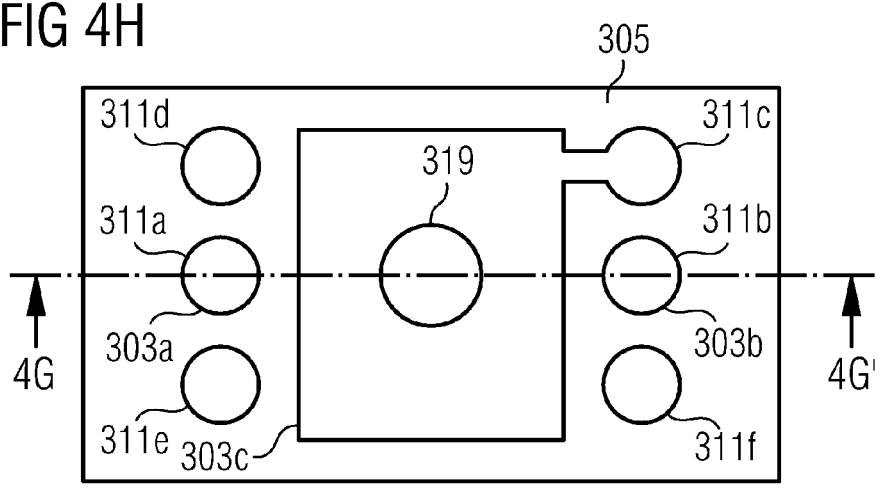

FIG. 4G is a cross section through the device of FIG. 4H along the line 4G-4G'. FIG. 4G depicts the device of FIG. 4F after a semiconductor chip 307 has been attached to molded structure 305 in cavity 309. The area of molded structure floor element 305a is larger than the main surfaces of semiconductor chip 307 so that semiconductor chip 307 can be placed and glued onto molded structure floor element 305a. At the same time, due to the cavity, the interface between semiconductor chip 307 and molded structure 305 is kept small. This way, the mechanical stress between molded structure 305 and semiconductor chip 307 caused by temperature cycles or material aging is small in comparison to semiconductor chips fully encapsulated in molded material.

In one embodiment, semiconductor chip 307 comprises a sensor, e.g. a pressure sensor or an optical sensor. In one embodiment, semiconductor chip 307 is attached to molded structure 305 in a way, that the sensing surface region faces through-hole 421. This way, the sensing surface of semiconductor chip 307 does not make contact with the surface of molded structure 305. In addition, the sensor of semiconductor chip 307 is exposed to measure pressure from, or light of the environment outside of the semiconductor device.

In one embodiment, semiconductor chip 307 is electrically connected with protruding metal elements 311a, 311b by means of interconnect elements (not shown in FIG. 4G). Interconnect elements may be bond wires, bond straps, bond clips and the like. In one embodiment, the bond wires are welded to chip 307 and protruding metal element 311 after semiconductor chip 307 has been attached to molded structure 305.

FIG. 4H is a cross section of the device of FIG. 4H along the line 4H-4H'. It depicts six separate protruding metal elements 311a, 311b, 311c, 311d, 311e, 311e that are each connected with respective metal carrier segments 303a, 303b, 303c, 303d, 303d, 303e, 303f. The carrier segments may also serve as external input/output contacts. FIG. 4H also discloses that metal carrier segment 303c is larger than the other metal carrier segments to provide electromagnetic shielding for the semiconductor chip 307 above metal carrier segments 303c.

FIGS. 5A-5L depict an embodiment of manufacturing a semiconductor device 400 wherein protruding metal elements 411a, 411b with first interlocking elements 317 are grown selectively to first masking layer 413, and wherein second interlocking elements 429 are grown selectively to molded structure 405 on top of first interlocking elements 417.

Figure 5A:
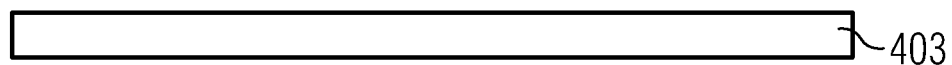
Figure 5B:
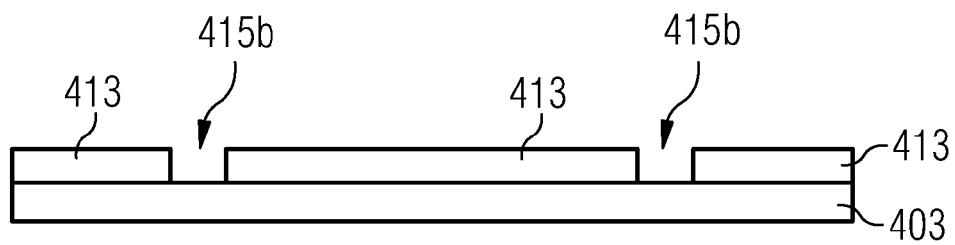
Figure 5C:
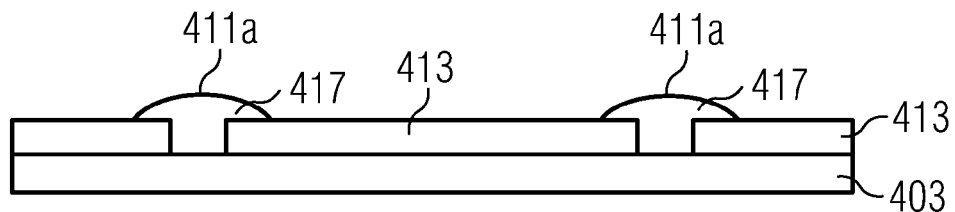

FIGS. 5A to 5C depict a process of manufacturing a semiconductor device that resembles the one of FIGS. 4A to 4C. FIG. 5A discloses a metal carrier 403 that may or may not be the same as metal carrier 303 of FIG. 4A. FIG. 5B discloses metal carrier 403 after a first masking layer 413 has been applied. First masking layer 413 defines circular openings 415a, 415b where protruding metal elements can be grown galvanically (electrochemically). Like in FIG. 4B, first masking layer 413 may be obtained by structuring a layer of photosensitive material. Alternatively, the material of first masking layer 413 may be made of other electrically insulating material, like polyimide, polyacrylate, polymethacrylate (e.g. PMMA), thermal cross-linkable Novolak-based mixtures, Polybenzoxazoles, Polybenzimidazoles, silicon containing organic polymers and also different Co-polymeric compounds of several classes. These are only some examples that can be complemented by a broad variety of further materials.

FIG. 5C depicts the device of FIG. 5B after protruding metal elements 411a, 411b have been grown galvanically in openings 415a, 415b by inserting the device into an electrolyte and by applying a voltage between the electrolyte and the device. The voltage is applied until the protruding metal elements 411a, 411b are grown over first masking layer 413 and have formed a mushroom shaped structure (first interlocking elements 417) reaching over first masking layer 413.

Figure 5D:
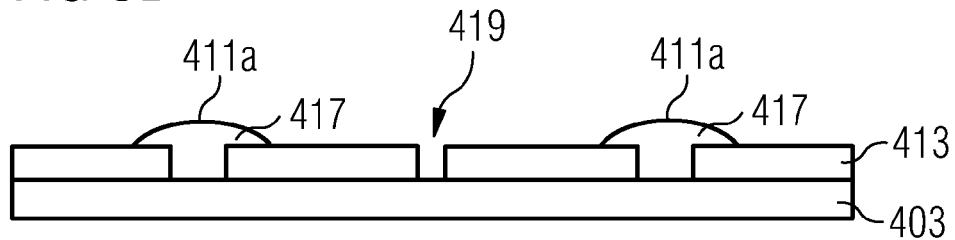

FIG. 5D depicts the device of FIG. 5C after first masking layer 413 has been structured a second time to provide an opening 419 for a through-hole through metal carrier 403. The structuring may be carried out photo-lithographically in conventional ways.

Figure 5E:
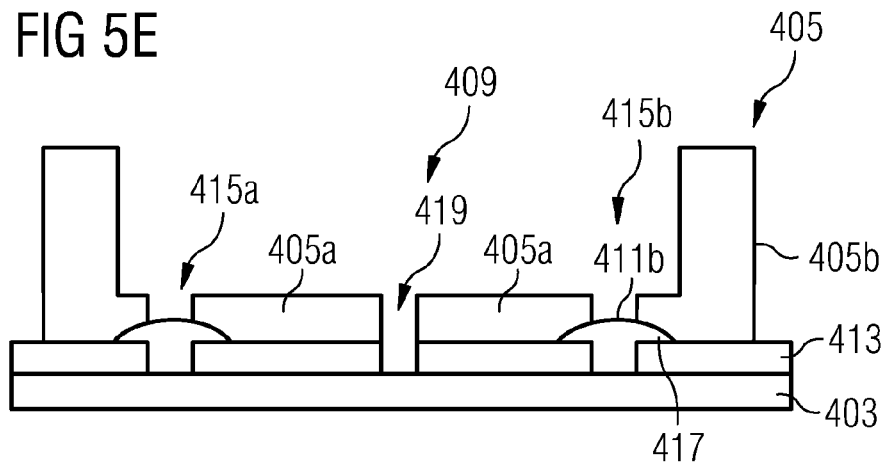

FIG. 5E depicts the device of FIG. 5D after the device has been placed into a mold for forming a molded structure 405 with a cavity 409. In one embodiment, molded structure 405 is shaped to become a housing defined by a molded structure floor element 405a and a molded structure wall element 405b surrounding the floor element 405a. Molded structure floor element 405a is structured to have further openings 415a, 415b reaching to the protruding metal elements 411a, 411b. In addition, molded structure 405 may have an opening reaching through first masking layer 413 to metal carrier 403.

Figure 5F:
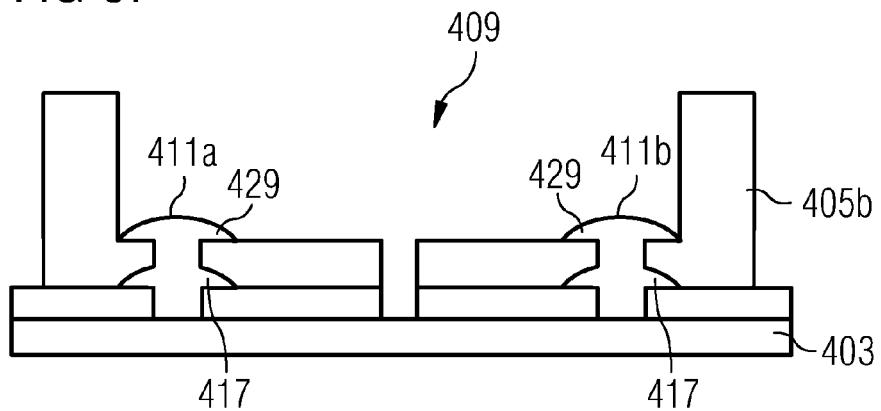

FIG. 5F depicts the device of FIG. 5E after a second galvanic process has been applied to grow second interlocking elements 429 in the openings 415 on top of the surfaces of first interlocking elements 417. With second interlocking elements 429 interlocked with molded structure 405, molded structure 405 is firmly held to metal carrier 403.

Figure 5G:
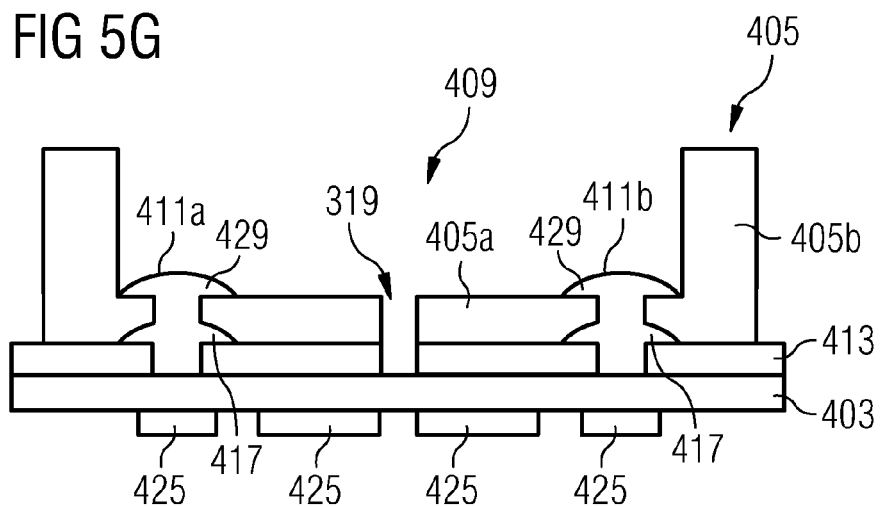

FIG. 5G depicts the device of FIG. 5F after a second masking layer 425 has been applied to the backside of metal carrier 403. Second masking layer 425 may be formed by conventional ways, e.g. by applying a photo-sensitive layer and structuring it photo-lithographically.

Figure 5H:
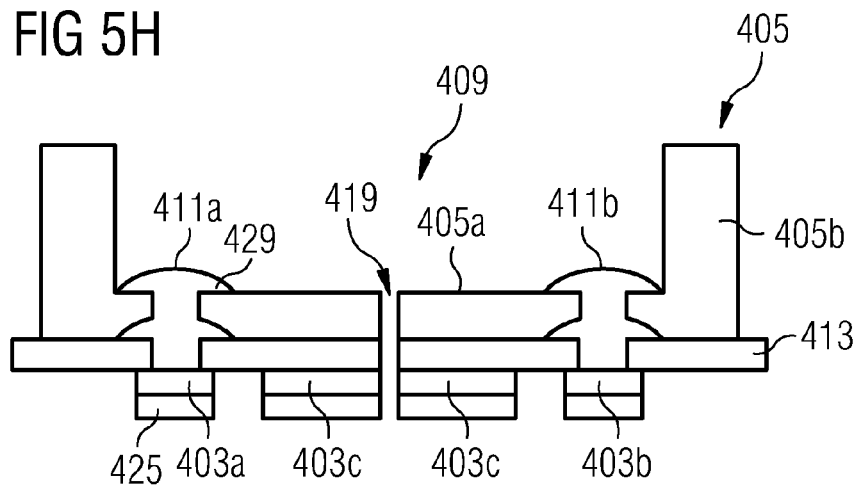
Figure 5I:
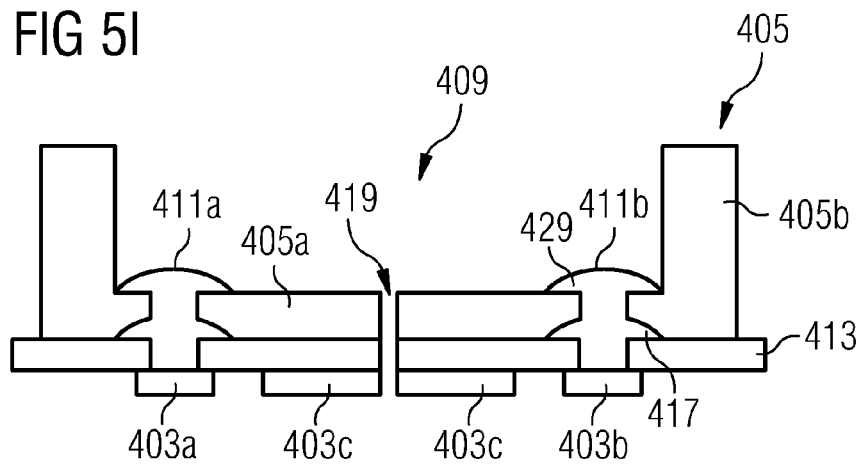
Figure 5J:
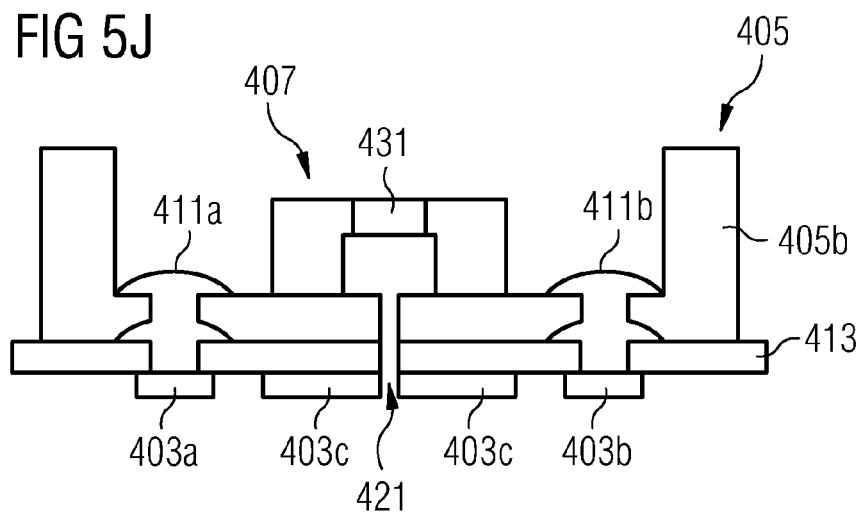

FIG. 5H depicts the device of FIG. 5G after metal carrier 403 has been etched selectively to second masking layer 425. The etching is carried out until metal carrier 403 becomes segmented into multiple disconnected metal carrier segments 403a, 403b, 403c. By etching metal carrier 403, first masking layer 413 becomes exposed in the etched metal carrier 403 regions. FIG. 5I discloses the device of FIG. 5H after second masking layer 425 has been removed. FIG. 5J discloses the device of FIG. 5I after semiconductor chip 407 has been attached in cavity 409 to molded structure floor element 405a. In one embodiment, semiconductor chip 407 is a sensor chip comprising a membrane 431. In one embodiment, semiconductor chip 407 is attached to molded structure floor element 405a such that membrane 431 is exposed to the environment through through-hole 421 such that membrane 431 can detect an external pressure even when cavity 409 is closed by a lid (not shown in FIG. 5J).

FIG. 5K is a cross-section through line 5K-5K' of FIG. 5L. FIG. 5K depicts the device of FIG. 5J after bond wires 427 (interconnect elements) have been used to electronically couple semiconductor chip 407 with respective protruding metal elements 411a, 411b. Alternatively, instead of using bond wires, bond clips, bond ribbon and the like can be used for electronically connecting semiconductor chip 407 with the protruding metal elements 411a, 411b. With semiconductor chip 407 electronically connected with protruding metal elements 411a, 411b, semiconductor chip 407 can be operated by using metal carrier segments 403a, 403b, 403c external as input/output terminals.

FIG. 5L is a vertical cross section of the device of FIG. 5H along the line 5L-4L'. It depicts six separate protruding metal elements 411a, 411b, 411c, 411d, 411e, 411e that are each connected with respective metal carrier segments 403a, 403b, 403c, 403d, 403d, 403e, 403f that may serve as external input/output contacts. FIG. 5L also discloses that metal carrier segment 403c is larger than the other metal carrier segments to provide electromagnetic shielding for the semiconductor chip 407 above metal carrier segments 403c.

FIGS. 6A-6C depict an embodiment for manufacturing a semiconductor device 500 where the steps for manufacturing the device of FIG. 6A may be the same as the ones discloses in FIG. 5A to FIG. 5E. In particular, FIG. 6A depicts metal carrier 503, first masking layer 513 applied to metal carrier 503, protruding metal elements 511a, 511b protruding from metal carrier 503 and each having first interlocking elements 517 for interlocking with first masking layer 513. FIG. 6A further depicts molded structure 505 forming a cavity 509 with molded structure floor element 505a and molded structure wall element 505b. Molded structure 505 and first masking layer 513 each have an opening that together defines an opening 519 for producing a through-hole through metal carrier 503. Molded structure 505 further include openings 515a, 515b for being able to access the tops of protruding metal elements 511a, 511b. Shape, structure and the various materials used for the embodiment of FIG. 6A may be the same or similar to the ones disclosed in FIG. 5E.

FIG. 6B depicts the device of FIG. 6A after metal carrier 503 has been segmented into multiple disconnected metal carrier segments 503a, 503b. Segmentation of metal carrier 503 may be carried out in the same or similar way as described in the previous embodiments.

FIG. 6C depicts the device of FIG. 6B after semiconductor chip 507 with membrane 531 has been attached to molded structure floor element 505a above through-hole 521. Through-hole 521 provides access from an external environment to membrane 531. FIG. 6C further discloses wire bonds 527 electrically connecting semiconductor chip 507 with protruding metal elements 511a, 511b. FIG. 6C differs from FIG. 5K in that the protruding metal elements 511a, 511b do not have second interlocking elements. Leaving the second interlocking elements away saves a second galvanic process step.

Figure 7A:
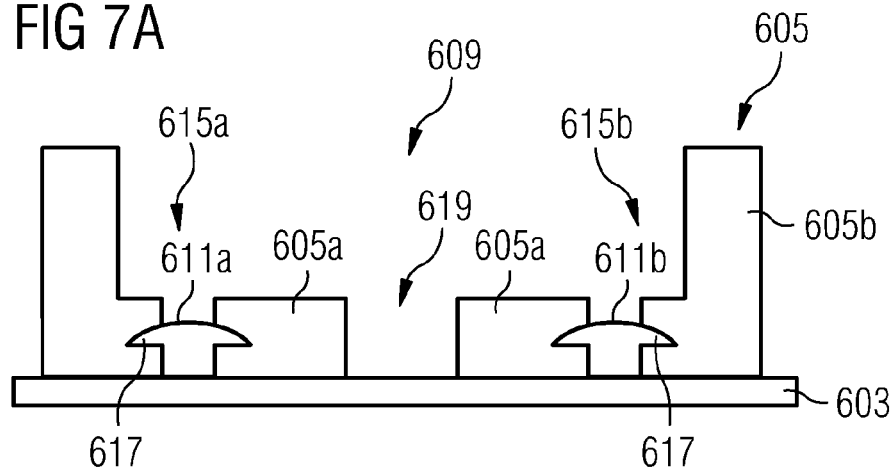
FIGS. 7A-7F schematically depict an embodiment of a method of manufacturing a semiconductor device comprising a first chip and a second chip.
Figure 7B:
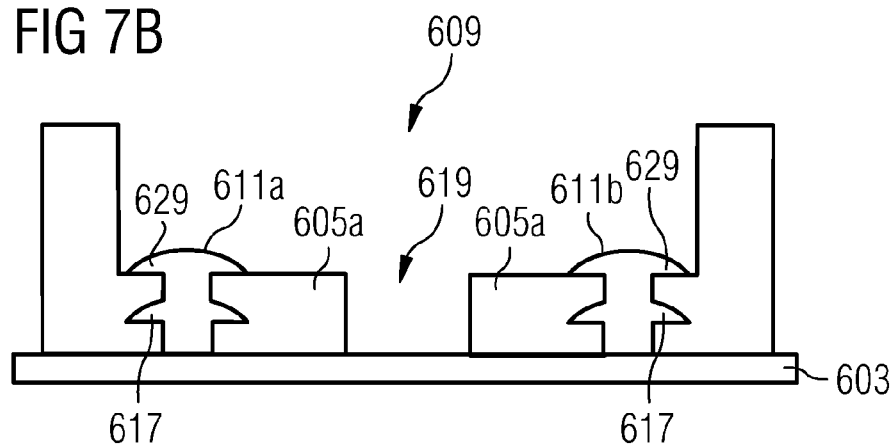
Figure 7C:
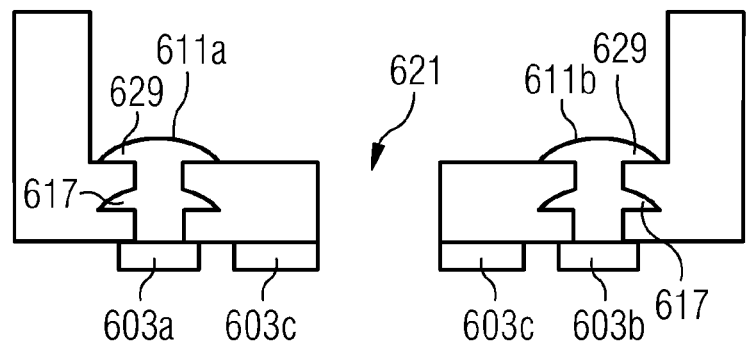

FIGS. 7A-7C depict an embodiment for manufacturing a semiconductor device 600 where the steps for manufacturing the device of FIG. 7A may be similar to, or the same as, the ones discloses in FIG. 4A to FIG. 4E. In particular, FIG. 7A discloses metal carrier 603 comprising eight protruding metal elements 611a, 611b protruding from a main face of metal carrier 603 and each having first interlocking elements 517 for interlocking molded structure 605. FIG. 6A discloses molded structure 605 forming a cavity 609 with molded structure floor element 605a and molded structure wall element 605b surrounding molded structure floor element 605a. Molded structure 605 defines an opening 619 for producing a through-hole through metal carrier 603. Molded structure 505 further includes openings 615a, 615b for accessing protruding metal elements 611a, 611b. Except for the openings 615a, 615b and the number of protruding metal elements, shape, structure and the materials used for the embodiment of FIG. 7A may be the same as the ones disclosed in FIG. 4E.

FIG. 7B depicts the device of FIG. 7A after a second interlocking element 629 has been grown selectively to molded structure 605 on top of first interlocking elements 617. In one embodiment, second interlocking element 629 has been grown by immersing the device of FIG. 7A into an electrolyte and by applying a voltage between electrolyte and metal carrier 603. Second interlocking element 629 is formed by having the metal grow above molded structure floor element 605a so that the metal grows on molded structure floor element 605a in lateral direction.

FIG. 7C depicts the device of FIG. 7B after metal carrier 603 has been segmented to obtain multiple metal carrier segments 603a, 603b, 603c and through-hole 621 through metal carrier 603. In one embodiment, metal carrier 603 has been segmented by applying a second masking layer (not shown) to the backside of metal carrier 603, and subsequently etching metal carrier 603 selectively to that masking layer (see FIG. 7C). In another embodiment, metal carrier 603 has been segmented without a second masking layer (FIG. 7C). In this case all but the protruding metal elements 611a, 611b are etched away to obtain the metal carrier segments 603a, 603b (not shown). In this case, the protruding metal elements 611a, 611b and the multiple metal carrier segments 603a, 603b are the same.

Figure 7D:
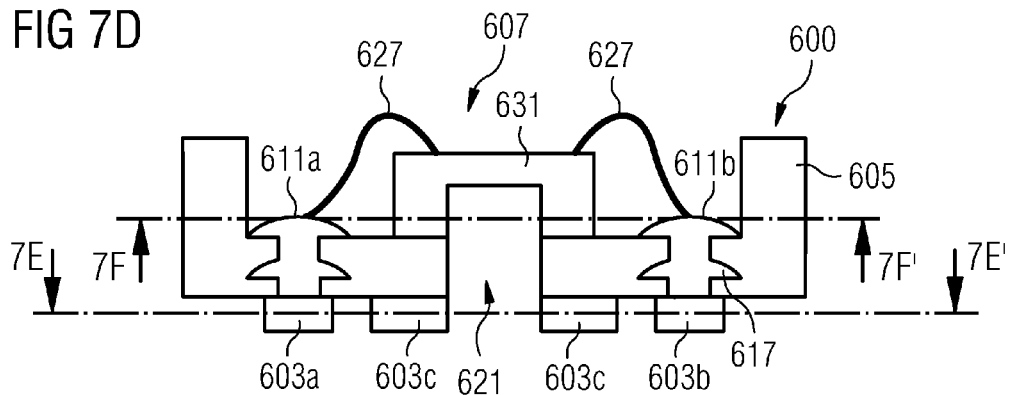
Figure 7E:
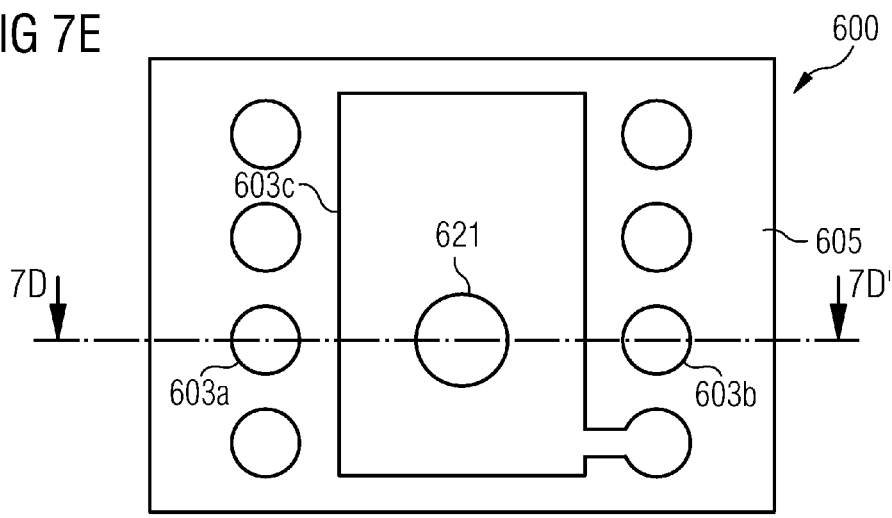
Figure 7F:
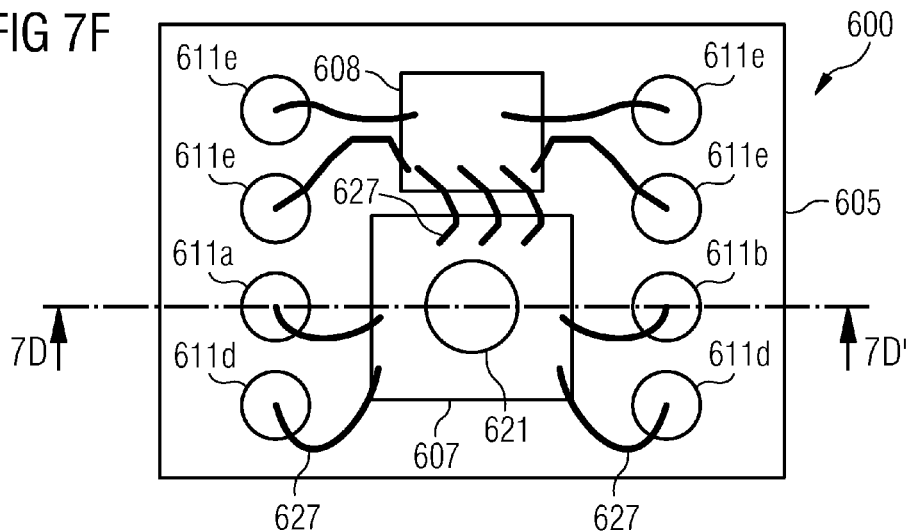

FIG. 7D-7F depict various cross sections of the device 600 of FIG. 7C after a sensor chip 607 (first semiconductor chip) and a sensor control chip 608 (second semiconductor chip) have been attached to molded structure 605. FIG. 7D is a cross section along the line 7D-7D' of FIGS. 7E and 7F, FIG. 7E is a cross section along the line 7E-7E' of FIG. 7D, and FIG. 7F is a cross section along the line 7F-7F'.

In one embodiment, sensor chip 607 may be a pressure sensor with a membrane 631 facing through-hole 621 to sense the pressure outside the device. In another embodiment, the sensor may also be a photonic sensor, an acceleration sensor and the like. Sensor chip 607 is connected with several bond wires 627 (interconnect elements) to protruding metal elements 611a, 611b, 611d.

Sensor control chip 608 may be a logic device that is capable of controlling the operation of sensor chip and, optionally, receiving signal data from the sensor chip. For that reason, sensor chip 607 and sensor control chip 608 are connected with each other with bond wires 627. Sensor control chip is also connected with several protruding metal elements 611e via bond wires 627.

While a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

What is claimed is:

1. A method of manufacturing a semiconductor device comprising:
   providing a metal carrier, wherein the metal carrier comprises at least one protruding metal element;
   placing the metal carrier into a mold and shaping the mold to define a molded structure for holding the metal carrier, wherein the at least one protruding metal element comprises an interlocking element for interlocking with the molded structure;
   segmenting the metal carrier from a backside of the metal carrier up to the molded structure to form at least two disconnected metal carrier segments held by the molded structure; and
   attaching a semiconductor chip to the molded structure.

2. The method according to claim 1 further comprising applying a first masking layer over the metal carrier and growing at least one protruding metal element on the metal carrier selectively to the masking layer.

3. The method according to claim 2 wherein the at least one protruding metal element is grown electrochemically with or without external electric current.

4. The method according to claim 3 wherein the at least one protruding metal element is grown until the at least one protruding metal element protrudes over the masking layer to form at least one interlocking element.

5. The method according to claim 1 wherein forming a molded structure for holding the metal carrier comprises at least one of applying liquid mold material to the metal carrier, attaching the molded structure to the metal carrier, and interlocking the molded structure with the metal carrier.

6. The method according to claim 2 wherein the molded structure is formed over the first masking layer.

7. The method according to claim 1 wherein the molded structure comprises a cavity and wherein the semiconductor chip is attached to the molded structure within the cavity.

8. The method according to claim 1 further comprising electronically coupling the semiconductor chip with the metal carrier by means of at least one interconnect element.

9. The method according to claim 1 further comprising electronically coupling the semiconductor chip with the at least one protruding metal element of the metal carrier.

10. The method according to claim 1 wherein the semiconductor chip comprises at least one of an integrated circuit, a sensor, a photonic sensor, a photonic emitter, a pressure sensor, an acoustic sensor, an acceleration sensor, and a chemical sensor.

11. A method of manufacturing a semiconductor device comprising:
    providing a metal carrier;
    applying a first masking layer over the metal carrier;

growing at least one protruding metal element on the metal carrier selectively to the first masking layer;

placing the metal carrier into a mold and shaping the mold to form a molded structure with at least a portion of the molded structure being engaged with the at least one protruding metal element;

segmenting the metal carrier from a backside of the metal carrier up to the molded structure to form at least two disconnected metal carrier segments; and attaching a semiconductor chip to the molded structure around the at least one protruding metal element.

12. The method of claim 11, wherein growing at least one protruding metal element on the metal carrier selectively to the first masking layer comprises:

providing at least one opening in the first masking layer; and growing the at least one protruding metal element galvanically in the at least one opening until the at least one protruding metal element is grown over the first masking layer.

13. The method of claim 11, further comprising:

shaping the molded structure to provide at least one first opening reaching to the at least one protruding element.

14. The method of claim 13, further comprising:

shaping the molded structure to provide at least one second opening reaching to the metal carrier through the first masking layer.

15. The method of claim 14 further comprising:

growing at least one second protruding metal element in the at least one first opening over the at least one protruding element.

16. The method of claim 15, segmenting the metal carrier from a backside of the metal carrier up to the molded structure to form at least two disconnected metal carrier segments comprises:

applying a second masking layer over the backside of the metal carrier;

removing at least one portion of the metal carrier up to the first masking layer; and removing the second masking layer.

17. The method of claim 15, wherein attaching a semiconductor chip to the molded structure around the at least one protruding metal element comprises:

attaching the semiconductor chip to the molded structure over the at least one second opening and around the at least one first and second protruding metal element.

* * * * *